United States Patent
Hsieh et al.

(10) Patent No.: US 11,211,232 B2
(45) Date of Patent: Dec. 28, 2021

(54) METHODS FOR CLEANING SEMICONDUCTOR DEVICE MANUFACTURING APPARATUS

(71) Applicant: Taiwan Semiconductor Manufacturing Co., Ltd., Hsinchu (TW)

(72) Inventors: Ian Hsieh, Hsinchu (TW); Che-fu Chen, Taipei (TW); Yan-Hong Liu, Zhudong Township (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 16/398,667

(22) Filed: Apr. 30, 2019

(65) Prior Publication Data

US 2020/0135435 A1    Apr. 30, 2020

Related U.S. Application Data

(60) Provisional application No. 62/752,228, filed on Oct. 29, 2018.

(51) Int. Cl.
*H01L 21/67* (2006.01)
*H01L 21/683* (2006.01)
(Continued)

(52) U.S. Cl.
CPC .. *H01J 37/32862* (2013.01); *H01L 21/67098* (2013.01); *H01L 21/6833* (2013.01); *A01D 5/00* (2013.01)

(58) Field of Classification Search
CPC ......... H01J 37/32862; H01L 21/67098; H01L 21/6833; H01L 21/67028; H01L 21/67046;
(Continued)

(56) References Cited

U.S. PATENT DOCUMENTS

| 5,746,928 A | * | 5/1998 | Yen | H01J 37/32862 134/1.1 |
| 2003/0013314 A1 | * | 1/2003 | Ying | H01L 21/32136 438/710 |

(Continued)

FOREIGN PATENT DOCUMENTS

CN    106040627 A * 10/2016

OTHER PUBLICATIONS

Machine translation of CN106040627A (Year: 2016).*

*Primary Examiner* — Douglas Lee
(74) *Attorney, Agent, or Firm* — Sterne, Kessler, Goldstein & Fox P.L.L.C.

(57) ABSTRACT

The present disclosure describes a chuck-based device and a method for cleaning a semiconductor manufacturing system. The semiconductor manufacturing system can include a chamber with the chuck-based device configured to clean the chamber, a loading port coupled to the chamber and configured to hold one or more wafer storage devices, and a control device configured to control a translational displacement and a rotation of the chuck-based device. The chuck-based device can include a based stage, one or more supporting rods disposed at the base stage and configured to be vertically extendable or retractable, and a padding film disposed on the one or more supporting rods.

20 Claims, 7 Drawing Sheets

(51) Int. Cl.
*H01J 37/32* (2006.01)
*A01D 5/00* (2006.01)

(58) Field of Classification Search
CPC ......... H01L 21/67057; H01L 21/67109; H01L 21/6831; H01L 21/68742; H01L 21/68764; H01L 21/67155; A01D 5/00
See application file for complete search history.

(56) References Cited

U.S. PATENT DOCUMENTS

| | | | |
|---|---|---|---|
| 2006/0040066 A1* | 2/2006 | Tsutae | C23C 16/4405 427/569 |
| 2006/0218680 A1* | 9/2006 | Bailey, III | B25J 5/00 414/217 |
| 2007/0028946 A1* | 2/2007 | Vogtmann | B08B 1/00 134/6 |
| 2008/0110397 A1* | 5/2008 | Son | H01L 21/68742 118/500 |
| 2008/0283088 A1* | 11/2008 | Shima | H01J 37/32862 134/1.1 |
| 2009/0120464 A1* | 5/2009 | Rasheed | H01L 21/67069 134/21 |
| 2010/0025372 A1* | 2/2010 | Tsujimoto | H01L 21/6833 216/71 |
| 2010/0133735 A1* | 6/2010 | Katsuta | B23Q 3/088 269/21 |
| 2012/0164923 A1* | 6/2012 | Jiang | B24B 53/017 451/56 |
| 2015/0034592 A1* | 2/2015 | Huff | H01J 37/3211 216/41 |
| 2016/0233115 A1* | 8/2016 | Huang | B08B 1/04 |
| 2017/0198395 A1* | 7/2017 | Nozawa | H01L 21/67069 |

* cited by examiner

METHODS FOR CLEANING SEMICONDUCTOR DEVICE MANUFACTURING APPARATUS

CROSS-REFERENCE TO RELATED APPLICATIONS

This application claims the benefit of U.S. Provisional Patent Application No. 62/752,228, titled "Semiconductor Apparatus and Method Thereof," filed on Oct. 29, 2018, the disclosure of which is incorporated by reference in its entirety.

BACKGROUND

With advances in semiconductor technology, there has been increasing demand for higher storage capacity, faster processing systems, higher performance, and lower costs. To meet these demands, the semiconductor industry continues to scale down the dimensions of semiconductor devices. Such scaling down has increased the complexity of semiconductor manufacturing processes and the demands for low contamination levels in semiconductor manufacturing systems.

BRIEF DESCRIPTION OF THE DRAWINGS

Aspects of this disclosure are best understood from the following detailed description when read with the accompanying figures. It is noted that, in accordance with the common practice in the industry, various features are not drawn to scale. In fact, the dimensions of the various features may be arbitrarily increased or reduced for clarity of discussion.

Illustrative embodiments will now be described with reference to the accompanying drawings. In the drawings, like reference numerals generally indicate identical, functionally similar, and/or structurally similar elements.

DETAILED DESCRIPTION

Figure 1:
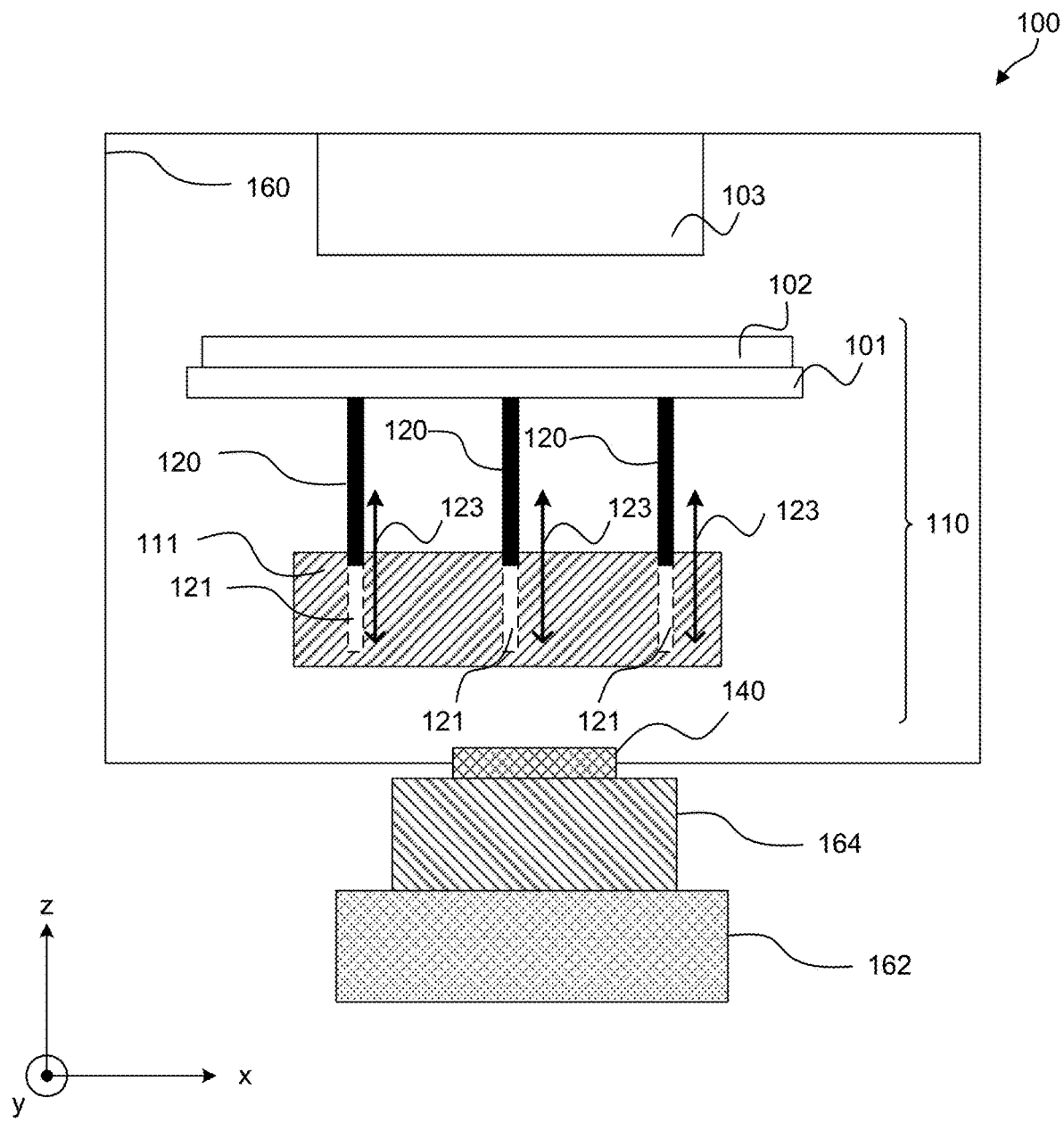
FIG. 1 illustrates a plan view of a semiconductor manufacturing apparatus, according to some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature on a second feature in the description that follows may include embodiments in which the first and second features are formed in direct contact, and may also include embodiments in which additional features may be formed between the first and second features, such that the first and second features may not be in direct contact. As used herein, the formation of a first feature on a second feature means the first feature is formed in direct contact with the second feature. In addition, the present disclosure may repeat reference numerals and/or letters in the various examples. This repetition does not in itself dictate a relationship between the various embodiments and/or configurations discussed.

Spatially relative terms, such as "beneath," "below," "lower," "above," "upper," and the like may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It is noted that references in the specification to "one embodiment," "an embodiment," "an example embodiment," "exemplary," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of one skilled in the art to effect such feature, structure or characteristic in connection with other embodiments whether or not explicitly described.

It is to be understood that the phraseology or terminology herein is for the purpose of description and not of limitation, such that the terminology or phraseology of the present specification is to be interpreted by those skilled in relevant art(s) in light of the teachings herein.

As used herein, the term "about" indicates the value of a given quantity that can vary based on a particular technology node associated with the subject semiconductor device. In some embodiments, based on the particular technology node, the term "about" can indicate a value of a given quantity that varies within, for example, 5-30% of the value (e.g., ±5%, ±10%, ±20%, or ±30% of the value).

The term "substantially" as used herein indicates the value of a given quantity that can vary based on a particular technology node associated with the subject semiconductor device. In some embodiments, based on the particular technology node, the term "substantially" can indicate a value of a given quantity that varies within, for example, ±5% of a target (or intended) value.

Semiconductor wafers are subjected to different fabrication processes (e.g., wet etching, dry etching, ashing, stripping, metal plating, and/or chemical mechanical polishing) in different semiconductor manufacturing apparatus during the fabrication of semiconductor devices. Generally, the quality of semiconductor devices depends on the performance of each semiconductor manufacturing apparatus used to form patterns of device/circuit elements on the semiconductor wafers. An equally important aspect of semiconductor devices manufacturing is the ability to consistently achieve a high yield of operable semiconductor devices on semiconductor wafers.

An overall yield of manufacturing semiconductor devices depends not only on an accuracy of each fabrication process, but also on a cleanliness of semiconductor manufacturing apparatus. For example, particle contaminants or accumulated chemical impurities in chambers of semiconductor manufacturing apparatus, such as plasma etching and chemical vapor deposition, can be re-deposited or outgassed on semiconductor wafers surfaces and cause manufacturing defects that reduce the yield of operable semiconductor devices. Hence, it is necessary to routinely clean components in the chambers to ensure proper fabrication yield. However, such cleaning procedure, if conducted manually (e.g., hand-operated cleaning), can be time-consuming and thus jeopardize throughput of semiconductor devices manufacturing.

The present disclosure is directed to a chuck-based device to conduct the cleaning procedure to reduce contaminants inside a chamber of a semiconductor manufacturing apparatus. In some embodiments, a semiconductor manufacturing system can include a chamber with the chuck-based device. In some embodiments, the chuck-based device can include a base stage and a padding film (e.g., a soft padding film) disposed on the base stage. The semiconductor manufacturing system can further include a control device to control motions of chuck's base stage to wipe inner surfaces of the chamber or components enclosed in the chamber with the padding film. Since the chuck-based device is housed in the chamber, the cleaning procedure can be conducted in-situ inside the chamber without disrupting operation of the semiconductor manufacturing system (e.g., disrupting a vacuum of the chamber, or opening seals of vacuum ports of the chamber), thus ensuring the overall manufacturing throughput and capacity of the semiconductor manufacturing system.

FIG. 1 shows a plan view of a semiconductor device manufacturing apparatus 100, according to some embodiments. Semiconductor device manufacturing apparatus 100 can include a chamber 160, a chuck-based device 110 housed inside chamber 160, a loading port 162, and a transfer tube 164. In some embodiments, semiconductor device manufacturing apparatus 100 can further include a cell 103 housed inside chamber 160, a gate valve 140 configured to provide a coupling between chamber 160, and another component in semiconductor device manufacturing apparatus 100, such as loading port 162 or transfer tube 164. Even though one gate valve 140, one cell 103, one loading port 162, and one transfer tube 164 are shown in FIG. 1, semiconductor device manufacturing apparatus 100 can have more than one gate valve, cell, loading port, or transfer tube similar to gate valve 140, cell 103, loading port 162, or transfer tube 164, respectively.

Chamber 160 can be configured as a processing chamber to provide a high vacuum environment to conduct a plurality of semiconductor manufacturing processes on semiconductor wafers (not shown) that require a vacuum environment (e.g., a vacuum pressure below $10^{-4}$ torr) to preserve, for example, a desired mean-free-path of reacting gases, plasma, and/or electrons in chamber 160 during semiconductor manufacturing processes.

In some embodiments, the plurality of semiconductor manufacturing processes can include deposition processes, such as molecular beam epitaxy (MBE), chemical vapor deposition (CVD), plasma-enhanced chemical vapor deposition (PECVD), low-pressure chemical vapor deposition (LPCVD), electrochemical deposition (ECD), physical vapor deposition (PVD), atomic layer deposition (ALD), metal organic chemical vapor deposition (MOCVD), sputtering, thermal evaporation, e-beam evaporation, or other deposition processes; etching processes, such as dry etching, reactive ion etching (ME), inductively coupled plasma etching (ICP), or ion milling; thermal processes, such as rapid thermal annealing (RTA); microscopy, such as scanning electron microscopy (SEM) and transmission electron microscopy (TEM); or any combination thereof.

In some embodiments, chamber 160 can be configured as a transfer chamber to transfer semiconductor wafers between an atmospheric environment and another processing chamber (not shown in FIG. 1) of semiconductor device manufacturing apparatus 100), where the other processing chamber can be configured to conduct the semiconductor manufacturing processes described above. For example, chamber 160 can be purged or vented to achieve an atmospheric pressure to receive the semiconductor wafers. Chamber 160 can also be pumped down to achieve a vacuum pressure level similar to that of the processing chamber.

Cell 103 can be configured as a gas cell to provide one or more gases, a plasma cell to provide plasma, or an effusion cell to provide atomic/molecular beam fluxes to chamber 160. The one or more gases provided by cell 103 can include an inert gas (e.g., nitrogen or air), or any processing gas (e.g., silane or tetrafluoromethane), for the semiconductor manufacturing processes. In some embodiments, cell 103 can be a shower head structure (not shown in FIG. 1) interconnected with a gas conduit or gas manifold. In some embodiments, cell 103 can further include an electrode structure (not shown in FIG. 1) configured to generate the plasma associated with the processing gas.

Chuck-based device 110 can include a padding stage 101, one or more supporting rods 120 configured to hold padding stage 101, and a base stage 111 configured to accommodate supporting rods 120. A motion mechanism (e.g., a motor, not shown in FIG. 1) can be further included in chuck-based device 110 to allow base stage 111 to be mobile and rotatable. As a result, a motion of padding stage 101 can be provided by base stage 111 through supporting rods 120. In some embodiments, base stage 111 can further include one or more conduits 121, where each of supporting rods 120 can be accommodated in the respective conduit 121 and be configured to be extendable or retractable vertically along bi-direction 123 (e.g., parallel to z-direction).

Padding stage 101 can have a mounting surface where an object (e.g., a substrate for semiconductor manufacturing processes conducted in chamber 160) can be placed on. As discussed above, a translation displacement and a rotation of padding stage 101 can be provided by base stage 111 via supporting rods 120, such that padding stage 101 can be configured to be rotatable and be movable from one position in chamber 160 to another position in chamber 160. For example, padding stage 101 can be moved towards/away from cell 103 by vertically (e.g., z-direction) lifting/lowing supporting rods 120. In some embodiments, padding stage 101 can be moved in a horizontal direction (e.g., x- or y-direction). Padding stage 101 can also be horizontally (e.g., x-y plane) rotated in a clockwise or a counter-clockwise direction.

In some embodiments, padding stage 101 can include a semiconductor wafer, a metallic plate, a glass plate, a plastic platform, or any other suitable plate made of insulating material, such as aluminum oxide (Al2O3/alumina) and/or aluminum nitride (AlN).

In some embodiments, padding stage 101 can have any suitable dimensions. For example, padding stage 101 can have a thickness of about 1 μm to about 1000 μm along the z axis, and a diameter of padding stage 101 can be about 6 inches, about 8 inches, or other values suitable to hold semiconductor wafers to be processed. In some embodiments, padding stage 101 can have a thickness of about 10 µm to about 800 µm along the z axis. In some embodiments, padding stage 101 can have a thickness of about 50 µm to about 700 µm along the z axis.

Chuck-based device 110 can be configured to clean one or more surfaces of chamber 160 or cell 103 with a padding film 102 (e.g., a soft padding film) disposed on padding stage 101. For example, chuck-based device 110 can be configured to use padding film 102 to clean particles or chemical contaminants (e.g., by-product coating from a previous deposition or etching process) adhered to a cleaning target, such as one or more areas of inner surfaces of chamber 160 or a surface of cell 103. For such cleaning process, padding stage 101 can be lifted upwards (e.g., in z-direction) until padding film 102 is in contact with the cleaning target. Padding stage 101 can rotate to wipe or rub the cleaning target using padding film 102. In some embodiments, padding stage 101 can also simultaneously provide a local displacement in the horizontal direction while padding film 102 is wiping or rubbing the cleaning target.

In some embodiments, padding film 102 can be placed on a substrate (not shown in FIG. 1), where the substrate can be further placed on padding stage 101.

In some embodiments, padding film 102 can include one or more of a wipe, a wiper, a textile, a cloth, a towel, a plastic sheet, or any other pad made of soft insulating material.

Loading port 162 can be configured to accommodate a wafer storage device (sometimes referred as front opening unified pod (FOUP)) for temporarily storing a batch of semiconductor wafers in a controlled environment with a designated gas pressure, gas ambient, humidity or temperature during intervals between the different semiconductor manufacturing processes. Loading port 162 can include a stage (not shown in FIG. 1) to hold the FOUP. In some embodiments, loading port 162 can include a chamber (not shown in FIG. 1) to accommodate the FOUP in a vacuum or an inert gas (e.g., under nitrogen ambient) environment.

Transfer tube 164 can be configured to provide a central transfer conduit to transfer semiconductor wafers between loading port 162 and chamber 160. In some embodiments, transfer tube 164 can include a robotic arm and a wafer orientation stage (both not shown in FIG. 1), where the robotic arm can be configured to transfer wafers between loading port 162, the wafer orientation stage, and chamber 160. In some embodiments, transfer tube 164 can be configured to be at atmospheric pressure or at a vacuum environment.

Figure 2A:
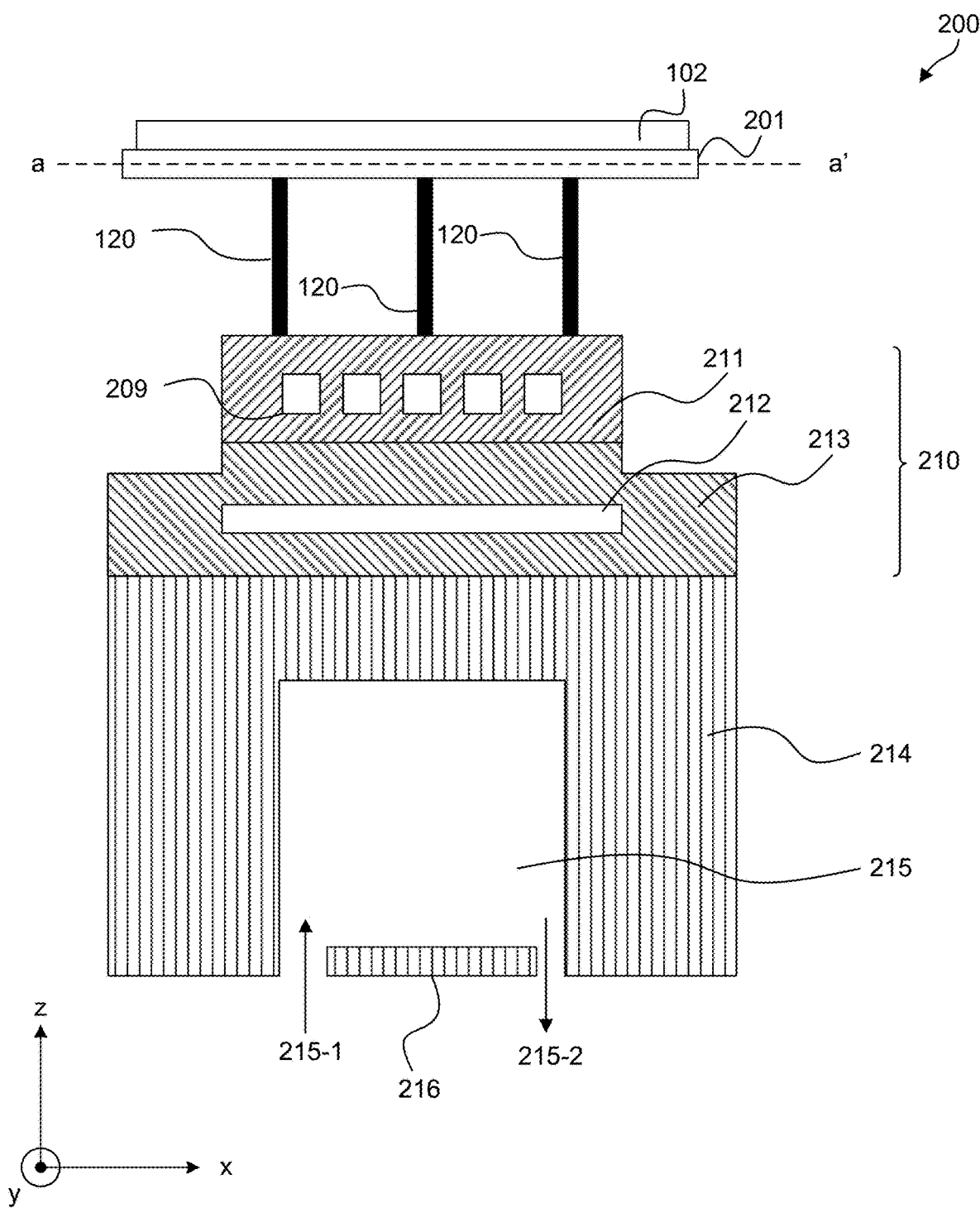
FIG. 2A illustrates a cross-sectional view of a wafer-holder structure, according to some embodiments.
Figure 2B:
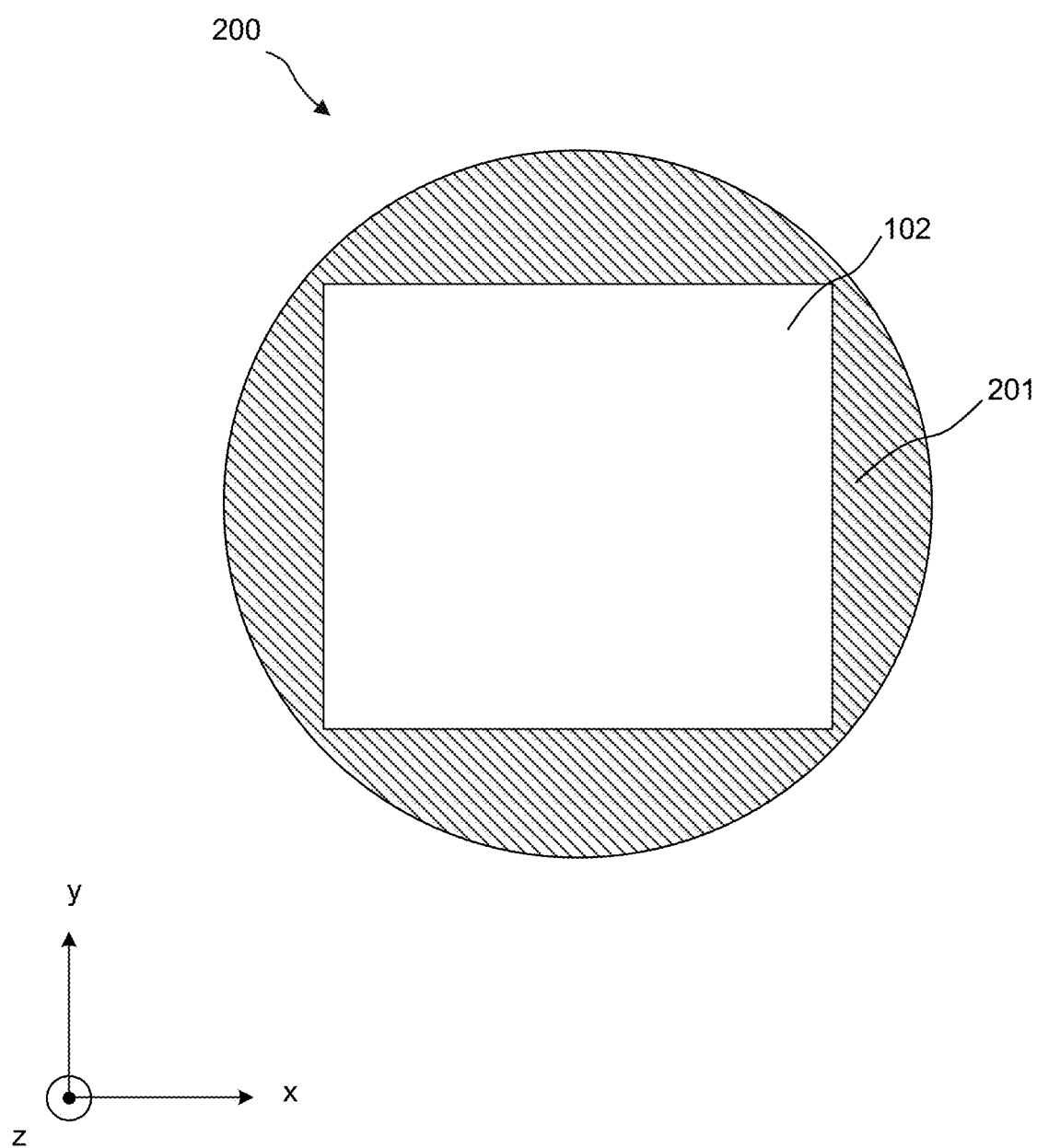
FIG. 2B illustrates a top view of a wafer-holder structure, according to some embodiments.

FIGS. 2A and 2B illustrate a wafer-holder structure 200, according to some embodiments. Wafer-holder structure 200 can be an embodiment of chuck-based device 110. The discussion of elements with the same annotations in FIG. 1 and FIGS. 2A-2B applies to each other unless mentioned otherwise. FIG. 2A illustrates a cross-sectional view of wafer-holder structure 200 along the x-z plane, and FIG. 2B illustrates a top view of wafer-holder structure 200 (along the a-a' direction) along the x-y plane. Wafer-holder structure 200 can include an electrostatic chuck (ESC) structure 210 configured to apply an electrostatic holding force to hold a wafer 201, padding film 102 disposed on ESC structure 210, and a base structure 214, where wafer 201 can be a substrate for semiconductor manufacturing processes conducted in chamber 160. Wafer 201 can also be an embodiment of padding stage 101. In some embodiments, wafer-holder structure 200 can further include one or more supporting rods 120 configured to support wafer 201, where padding film 102 can be placed on wafer 201 and supporting rods 120 can be embedded in ESC structure 210. In some embodiments, supporting rods 120 can be configured to contact and hold padding film 102.

ESC structure 210 can include a base platen 211, an electrode 209 embedded in base platen 211, a heat insulating component 213, and a heating component 212 embedded in heat insulating component 213. ESC structure 210 can be fixed on base structure 214. Base structure 214 can include a cooling component for adjusting the temperature of base platen 211. In some embodiments, the cooling component can include a gas tunnel 215 that allows a heat transfer gas (e.g., helium gas) to circulate through inlet 215-1 and outlet 215-2. The arrows at inlet 215-1 and outlet 215-2 indicate the directions of the gas flow. In some embodiments, base structure 214 can include a bottom portion 216 that seals gas tunnel 215 between inlet 215-1 and outlet 215-2. Other structures/devices between ESC structure 210 and base structure 214 are not shown for simplicity.

Base platen 211 can have a mounting surface, where wafer 201 can be placed on. Base platen 211 can include any suitable insulating material, such as aluminum oxide and/or aluminum nitride. Base platen 211 can have any suitable dimensions, such as dimensions similar to that of wafer 201. In some embodiments, one or more conduits 121 can be embedded in base platen 211 to accommodate respective supporting rods 120.

Electrode 209 can be in the shape of a thin film, embedded in base platen 211. Electrode 209 can be connected to a power supply (inside or outside of wafer-holder structure 200, not shown) so that a voltage can be applied to electrode 209 by the power supply to generate a Coulomb force between ESC structure 210 and wafer 201. Wafer 201 can then be attracted to the mounting surface of base platen 211. The magnitude of the voltage can be proportional to the coulomb force that attracts wafer 201. Electrode 209 can include any suitable conductive material, such as tungsten, molybdenum, etc.

Heat generating component 212 can be connected to a power supply (inside or outside of wafer-holder structure 200, not shown) to generate heat when a voltage is applied to heat generating component 212. Heat generating component 212 can heat base platen 211 to a desired temperature, e.g., between about 60 degrees Celsius and about 600 degrees Celsius. In some embodiments, heating generating component 212 can heat base platen 211 to between about 80 degrees Celsius and about 400 degrees Celsius. In some embodiments, heating generating component 212 can heat base platen 211 to between about 100 degrees Celsius and about 300 degrees Celsius. Heat generating component 212 can include any suitable material of sufficiently low specific heat capacity, such as metals (e.g., copper (Cu), tungsten (W), and/or nickel (Ni)). Heat generating component 212 can be uniformly distributed in heat insulating component 213 and have suitable dimensions. For example, heat generating component 212 can have a thickness of about 3 µm to about 120 µm. In some embodiments, heat generating component 212 can have a thickness of about 5 µm to about 100 µm. In some embodiments, heat generating component 212 can have a thickness of about 10 µm to about 80 µm.

Heat insulating component 213 can include an insulating material to cover heat generating component 212. Heat insulating component 213 can include a suitable insulating material, such as an insulating resin (e.g., polyimide, low-melting-point glass, alumina, and/or silica). A thermal expansion coefficient of heat insulating component 213 can be similar or comparable to a thermal expansion coefficient of base platen 211. Heat insulating component 213 can have any suitable length along the z-axis. For example, heat insulating component 213 can have a thickness of about 10 μm to about 1.5 cm. In some embodiments, heat insulating component 213 can have a thickness of about 30 μm to about 1.0 cm. In some embodiments, heat insulating component 213 can have a thickness of about 50 μm to about 0.8 cm.

Base structure 214 can provide support to ESC structure 210. Base structure 214 can include materials of sufficient stiffness and corrosion resistance, such as aluminum or a protection coating, e.g., an alumite layer. Base structure 214 can include a cooling component that can adjust the temperature of the mounting surface of base platen 211. The cooling component can include a gas tunnel 215. A heat transfer gas can circulate in gas tunnel 215 through inlet 215-1 and outlet 215-2. A bottom portion 216 can seal the heat transfer gas between inlet 215-1 and outlet 215-2. The arrows indicate the directions of the gas flow. The heat transfer gas can include any suitable gas, such as helium. The cooling component can also include gas passages (not shown) that connect gas tunnel 215 to the mounting surface of base platen 211 (e.g., under wafer 201) so the heat transfer gas can cool the surface temperature of base platen 211, thus adjusting the processing temperature of wafer 201. Optionally, the cooling component can include a fluid passage that allows a heat transfer fluid to circulate around/under heat insulating component 213 and to adjust the surface temperature of base platen 211. The fluid can include, e.g., water. For ease of viewing, the fluid passage is not shown in the figures.

Wafer-holder structure 200 can be configured to clean interior of chamber 160 or cell 103. As shown in FIG. 2B, padding film 102 can be attached to wafer 201 via an adhesive, a tape, or any mechanical component such as screws or clamps. Despite padding film 102 being smaller than wafer 201 in FIG. 2B, padding film 102 can have a similar to larger size than wafer 201 in other embodiments. Padding film 102 together with wafer 201 can be lifted upwards or downwards along z-direction by stretching or retracing supporting rods 120. Padding film 102 together with wafer 201 can also be displaced along a horizontal direction (e.g., x- or y-direction) by ESC structure 210. In response padding film 102 is in contact with a cleaning target, such as inner surfaces of chamber 160 or a surface of cell 103, ESC structure 210 can be configured to rotate and/or the displace padding film 102 together with wafer 201 to wipe or rub the cleaning target.

In some embodiments, padding film 102 can be dipped in de-ionized water or an organic solvent, such as isopropanol or alcohol, to enhance a wiping efficiency to remove particles or chemical contaminants from surfaces of the cleaning target.

Figure 3:
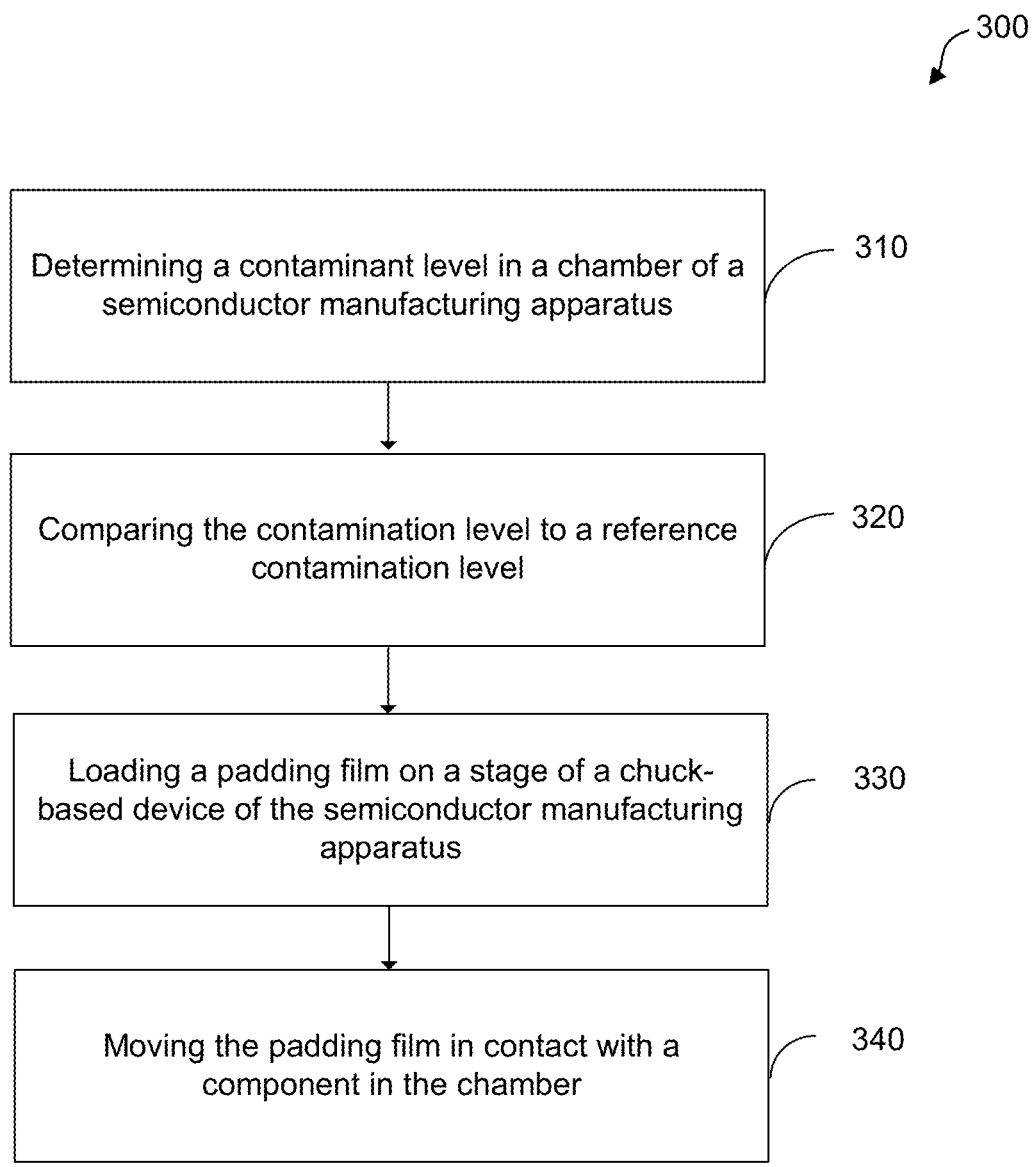
FIG. 3 illustrates a method for operating a chuck-based device to clean a semiconductor manufacturing apparatus, according to some embodiments.

FIG. 3 is an exemplary method 300 for operating a chuck-based device to clean a semiconductor manufacturing apparatus, where the chuck-based device can be housed in an interior of a chamber of a semiconductor manufacturing apparatus, according to some embodiments. This disclosure is not limited to this operational description. It is to be appreciated that additional operations may be performed. Moreover, not all operations may be needed to perform the disclosure provided herein. Further, some of the operations may be performed simultaneously, or in a different order than shown in FIG. 3. In some implementations, one or more other operations may be performed in addition to or in place of the presently described operations. For illustrative purposes, method 300 is described with reference to the embodiments of FIG. 1. However, method 300 is not limited to these embodiments.

Exemplary method 300 begins with operation 310, where a contamination level in a chamber, which accommodates the chuck-based device, is determined. The contamination level in the chamber can be a level of particles or a level of chemical by-products from previous manufacturing processes. The contamination level in the chamber can be determined by placing a sample substrate in the chamber, followed by detecting respective contaminants transferred from the chamber to the sample substrate surface. For example, the sample substrate can be a semiconductor wafer or any other plates, such as a glass, plastic, or metallic plate. The sample substrate is placed on the chuck-based device or any other stage/platform in the chamber. After the sample substrate is loaded in the chamber, one or more semiconductor processes associated with the chamber can be optionally applied to the sample substrate. For example, the chamber configured to conduct reactive ion-etching (ME) can apply the respective ME processes on the sample substrate. The sample substrate can then be transferred out the chamber, followed by detecting the respective contamination level on one or more areas the sample substrate surface via a particle counter, surface profiler, or any microscopy. In some embodiments, the respective contamination level can be detected via any surface chemistry analysis technique, such as X-ray photoelectron (XPS) or energy-dispersive X-ray spectroscopy (EDAX).

In operation 320, the contamination level is compared to a reference level. The reference level can be a pre-determined threshold of a particle count or a pre-determined threshold of an amount of a chemical trace. The reference level can represent or be associated with a desired cleanness requirement of the semiconductor manufacturing apparatus's chamber. For example, the reference level can be a pre-determined threshold of particle count, where a fabrication process conducted in a chamber with or below the reference level of particle count can achieve a desired production yield of semiconductor devices manufacturing. As another example, the reference level can be a pre-determined atomic concentration of a chemical trace (e.g., heavy metal trace), where a manufacturing of semiconductor devices conducted in a chamber with or below the reference level of the chemical trace can generate a high purity of semiconductor device layers, thus achieving a desired electrical performance of semiconductor devices. In some embodiments, the reference level can be determined or learned from one or more historical semiconductor manufacturing processes conducted in the chamber or another similar semiconductor manufacturing apparatus. The comparison between the contamination level and the reference level can include subtracting the contamination level from the reference level. In some embodiments, the comparison can include subtracting the contamination level from an averaged attribute (e.g., an averaged particle count from one or more areas of the sample substrate) of the reference level. In some embodiments, the comparison can be performed by a computer system as described in FIG. 6.

In response to the contamination level being equal to or above the reference level, the semiconductor manufacturing apparatus is cleaned based on operations 330-350.

In operation 330, a padding film is loaded on a stage of the chuck-based device in the chamber of the semiconductor manufacturing apparatus. The padding film can be placed in a transfer module (e.g., a robotic arm) outside of and interconnected with the chamber, where the transfer module can transfer the padding film into the chamber and place the padding film on the stage of the chuck-based device. For example, the chamber can be under a vacuum level, where the padding film can be initially placed on a wafer station of the transfer module under an atmospheric environment. The transfer module can then be pumped down to match its vacuum level to that of the chamber, followed by delivering the padding film from the wafer station of the transfer tube to the chuck-based device housed in the chamber via a robotic arm of the transfer module. Details of operation 330 can be referred to the description of FIG. 1.

In some embodiments, the chamber can be placed under the atmospheric environment, where the padding film can be manually placed on the chuck-based device through a port or a flange of the chamber. In some embodiments, the padding film can be dipped or sprayed with an isopropanol, an alcohol, an organic solvent, or a de-ionized water before or after placement on the chuck-based device's stage.

In operation 340, the padding film is moved to be in contact with a component in the chamber. A position of the padding film can be controlled by a motion of the stage provided by the chuck-based device. For example, referring to FIG. 1, the padding film disposed on the stage can be moved along a horizontal or a vertical direction in the chamber by the chuck-based device. The chuck device can shift the padding film at any designated x-y-z coordinate in the chamber. In some embodiments, the chuck device can shift the stage, which holds the padding film, towards the component until the padding film is in contact with the component in the chamber. The component can be any fabrication device which is housed in the chamber and subject to contamination. For example, the component can be a plasma cell or a gas cell housed in the chamber. In some embodiments, the component can also be one or more areas of inner surfaces of the chamber.

Further, in operation 340, the component is cleaned using the padding film. In response to the padding film being in contact with the component, the padding film can be controlled by the chuck-based device to wipe a surface of the component. Referring to FIG. 1, for example, the chuck-based device can rotate the stage holding the padding film, such that the padding film can continuously rub the component surface. The chuck-based device can also displace the padding film to rub one or more areas of the component surface. By rubbing or wiping the component, contaminants on the component surface can be transferred to the wipe, thus eliminating or reducing the respective contamination level in the chamber.

Figure 4:
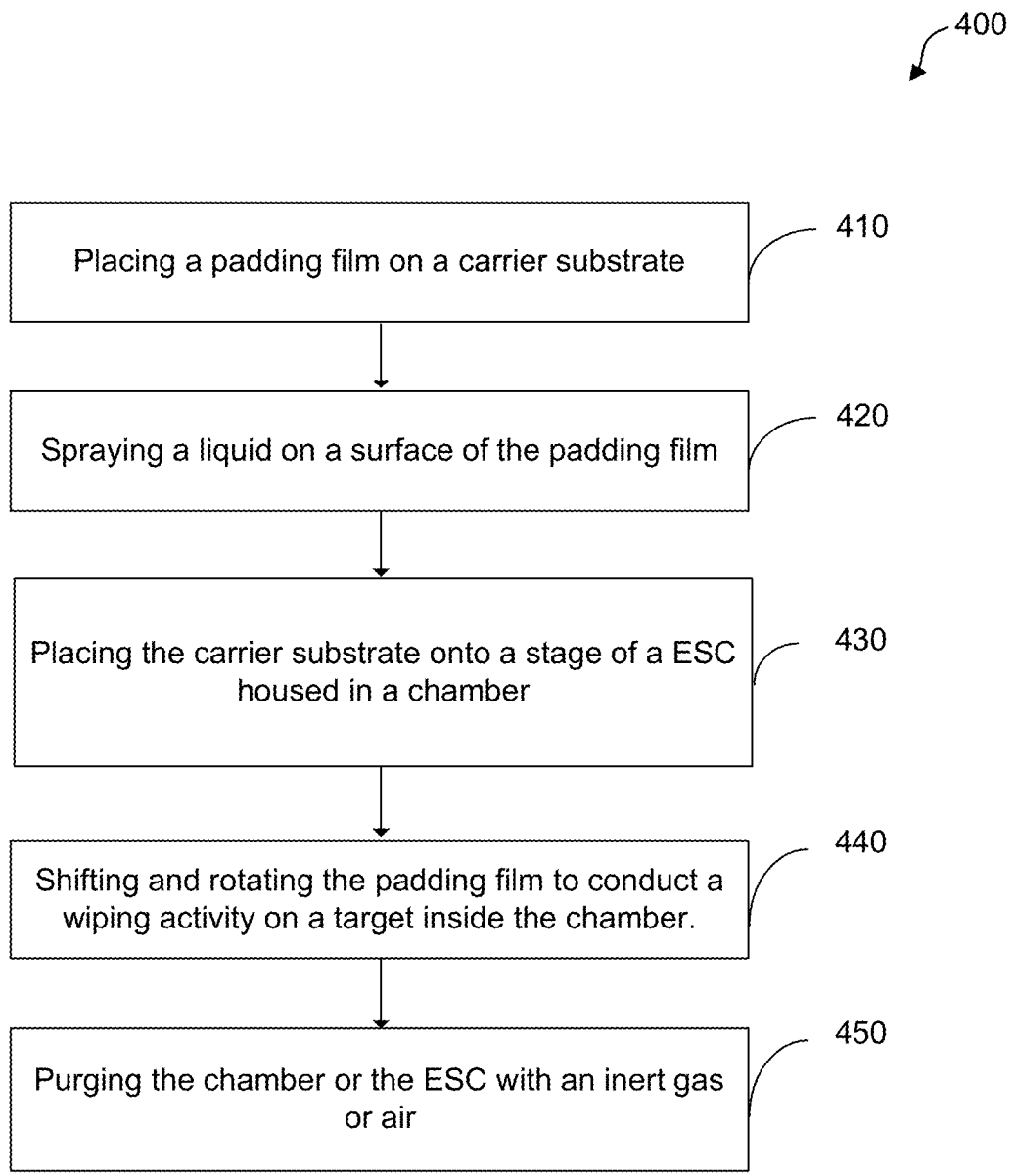
FIG. 4 illustrates a method for operating an electrostatic chuck (ESC) to clean a semiconductor manufacturing apparatus, according to some embodiments.

FIG. 4 is an exemplary method 400 for operating a ESC to clean a semiconductor manufacturing apparatus, where the ESC can be enclosed in a chamber of a semiconductor manufacturing apparatus, according to some embodiments. This disclosure is not limited to this operational description. It is to be appreciated that additional operations may be performed. Moreover, not all operations may be needed to perform the disclosure provided herein. Further, some of the operations may be performed simultaneously, or in a different order than shown in FIG. 4. In some implementations, one or more other operations may be performed in addition to or in place of the presently described operations. For illustrative purposes, method 400 is described with reference to the embodiments of FIGS. 2A-2B. However, method 400 is not limited to these embodiments.

Exemplary method 400 begins with operation 410, where a padding film is placed on a carrier substrate, such as a semiconductor wafer. The padding film can be placed on the carrier substrate under an atmospheric environment or an inert gas environment (e.g., in a nitrogen glove box). The padding film can be further attached on the carrier substrate via an adhesive, a tape, a mechanical component (e.g., a screw or a clamp), or a Van der Waals force provided by a liquid. Details of operation 410 can be referred to the description of FIGS. 2A-2B.

In operation 420, a liquid is sprayed on a surface of the padding film. The liquid can be a detergent to enhance the padding film's wiping efficiency to clean the chamber of the semiconductor manufacturing apparatus and can include a de-ionized water or any organic solvent such as isopropanol or alcohol. In some embodiments, the carrier substrate together with the padding film can be immersed in a pool or a tank of the liquid.

In operation 430, the carrier substrate is placed on a stage of the ESC housed in the chamber of the semiconductor manufacturing apparatus. The ESC can be configured to further provide a coulomb force (e.g., an electrostatic force) to attract the carrier substrate to the ESC stage. Referring to FIG. 2A, for example, one or more electrodes in the ESC can be connected to a power supply such that the respective voltage on the one or more electrode can generate the coulomb force to attract the carrier substrate to the padding film.

In some embodiments, the carrier substrate can be placed on a wafer station of a transfer module interconnected with the chamber, where the wafer station can be under an atmospheric environment. The transfer module then can be pumped down to a vacuum level matched with the chamber. A robotic arm of the transfer module can deliver the carrier substrate from the wafer station to the ESC stage.

In operation 440, the padding film is shifted and rotated to conduct a wiping activity on a target inside the chamber. The target can be a component (e.g., a plasma cell or a gas cell) inside the chamber or one or more inner surfaces of the chamber. The ESC stage can move the padding film to be in contact with the target, followed by shifting and rotating the padding film to conduct the wiping activity to rub surfaces of the target. Such wiping activity can remove contaminants (e.g., particles or by-product chemical trace) adhered to surfaces of the target, thus eliminating or reducing the respective contamination level in the chamber. After the wiping activity, the ESC stage can move the padding film away from the target.

In operation 450, the chamber or the ESC stage is purged with an inert gas or air. Since the liquid (e.g., organic solvent) used to facility the wiping efficiency can be left on the target surfaces during the wiping activity, the purging can be applied to blow dry the liquid from the target surfaces. In some embodiments, the purging can be conducted by flowing the inert gas (e.g., nitrogen) from the wiped target (e.g., the plasma cell or the gas cell) or any other gas outlet in the chamber. After the purging, the padding film together with the carrier substrate can be transferred out the chamber and get replaced.

Figure 5:
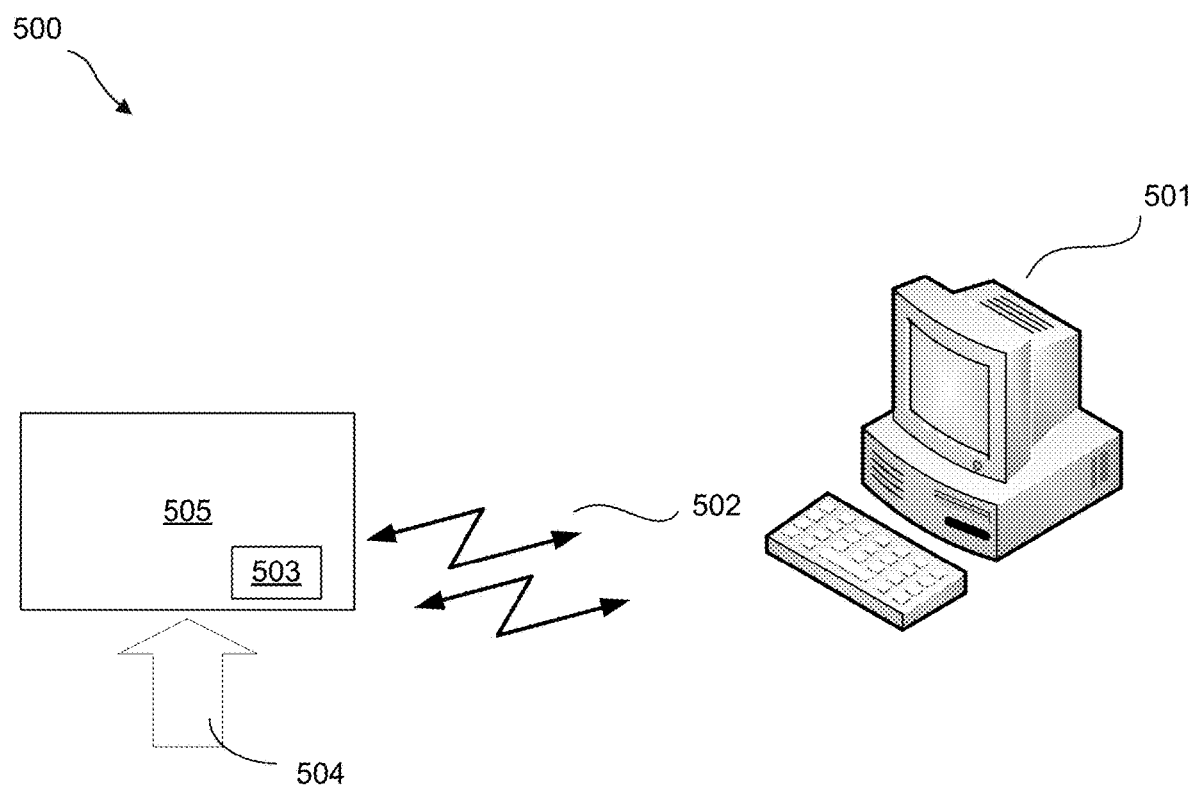
FIG. 5 illustrates a control system, according to some embodiments.

FIG. 5 illustrates a semiconductor manufacturing system 500 using a chuck-based device of the present disclosure, according to some embodiments. As shown in FIG. 5, semiconductor manufacturing system 500 can include a control unit/device 501, a communication mechanisms 502, and a chuck-based device 503 contained in a semiconductor device manufacturing apparatus 505. Control unit/device 501 can include any suitable computer system (e.g., workstation and portable electronic device) to store programs and data for various operations of semiconductor device manufacturing apparatus 505, such as instructing semiconductor device manufacturing apparatus 505 to conduct a semiconductor manufacturing process on a wafer placed on chuck-based device 503 and controlling a motion of chuck-base device 503, where the motion can be a translational displacement or a rotation. The different functions of control unit/device 501 should not be limited by the embodiments of the present disclosure. Communication mechanism 502 can include any suitable network connection between control unit/device 501 and semiconductor device manufacturing apparatus 505. For example, communication mechanism 502 can include a local area network (LAN) and/or a WiFi network. In some embodiments, control unit/device 501 can transmit control signals through communication mechanism 502 to control the motion of chuck-based device 503. Chuck-based device 503 can be housed in a chamber of semiconductor device manufacturing apparatus 505, where chuck-based device 503 and semiconductor device manufacturing apparatus 505 can be an embodiment of chuck-based device 110 and semiconductor device manufacturing apparatus 100, respectively. In some embodiments, chuck-based device 503 can include an ESC structure configured to provide an electrostatic force to attract a substrate to a stage of chuck-based device 503.

Figure 6:
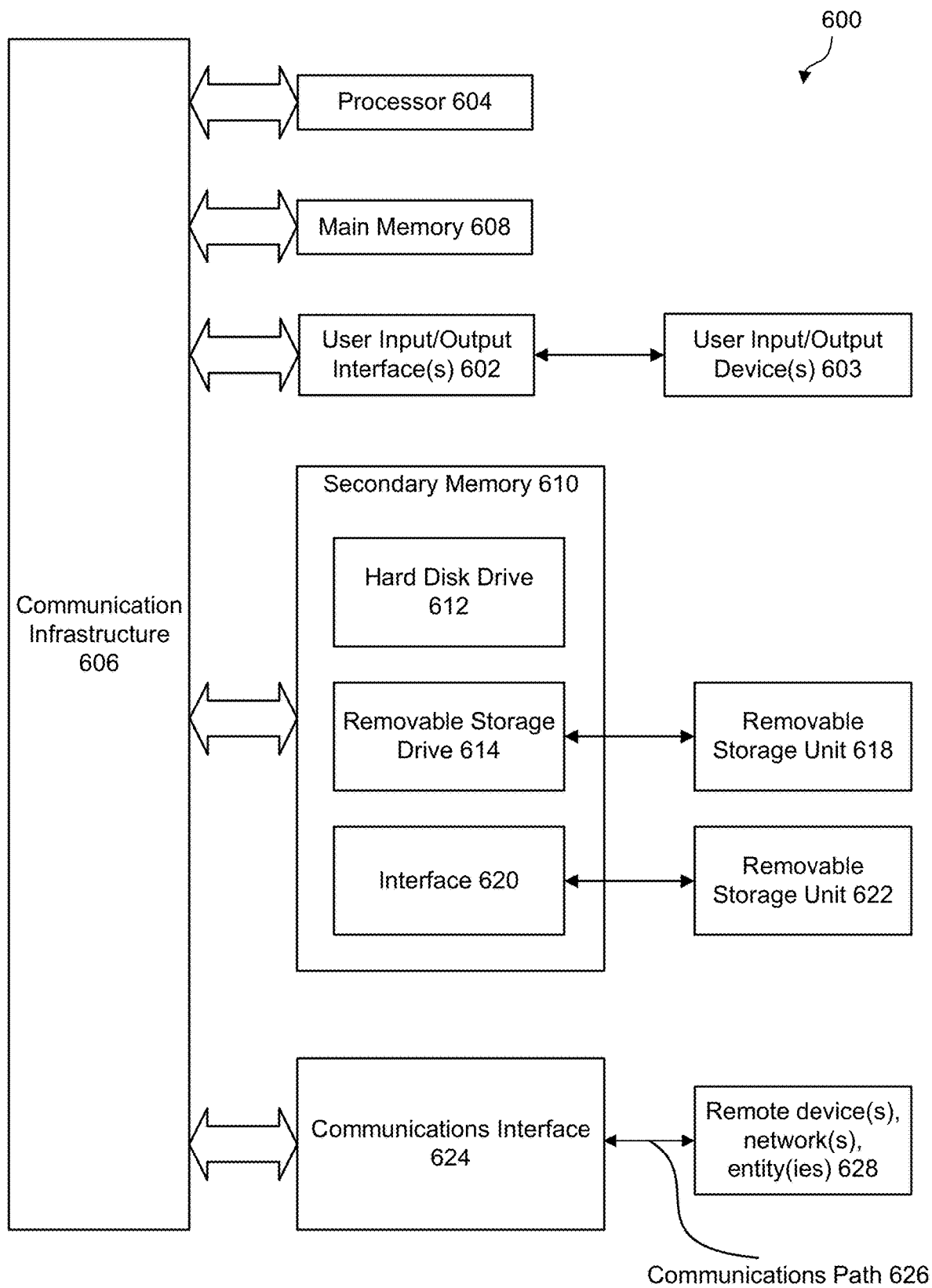
FIG. 6 illustrates a computer system for implanting various embodiments of the present disclosure, according to some embodiments.

FIG. 6 is an illustration of an example computer system 600 in which various embodiments of the present disclosure can be implemented, according to some embodiments. Computer system 600 can be used, for example, in control unit/device 501 of FIG. 5. Computer system 600 can be any well-known computer capable of performing the functions and operations described herein. For example, and without limitation, computer system 600 can be capable of processing and transmitting signals. Computer system 600 can be used, for example, to control the motion of chuck-based device 503.

Computer system 600 includes one or more processors (also called central processing units, or CPUs), such as a processor 604. Processor 604 is connected to a communication infrastructure or bus 606. Computer system 600 also includes input/output device(s) 603, such as monitors, keyboards, pointing devices, etc., that communicate with communication infrastructure or bus 606 through input/output interface(s) 602. A control tool can receive instructions to implement functions and operations described herein—e.g., the functions of semiconductor manufacturing system 500 described in FIG. 5 and the method/process described in FIGS. 3-4—via input/output device(s) 603. Computer system 600 also includes a main or primary memory 608, such as random access memory (RAM). Main memory 608 can include one or more levels of cache. Main memory 608 has stored therein control logic (e.g., computer software) and/or data. In some embodiments, the control logic (e.g., computer software) and/or data can include one or more of the functions described above with respect to semiconductor device manufacturing apparatus 100. In some embodiments, processor 604 can be configured to execute the control logic stored in main memory 608.

Computer system 600 can also include one or more secondary storage devices or memory 610. Secondary memory 610 can include, for example, a hard disk drive 612 and/or a removable storage device or drive 614. Removable storage drive 614 can be a floppy disk drive, a magnetic tape drive, a compact disk drive, an optical storage device, tape backup device, and/or any other storage device/drive.

Removable storage drive 614 can interact with a removable storage unit 618. Removable storage unit 618 includes a computer usable or readable storage device having stored thereon computer software (control logic) and/or data. Removable storage unit 618 can be a floppy disk, magnetic tape, compact disk, DVD, optical storage disk, and/any other computer data storage device. Removable storage drive 614 reads from and/or writes to removable storage unit 618 in a well-known manner.

According to some embodiments, secondary memory 610 can include other mechanisms, instrumentalities or other approaches for allowing computer programs and/or other instructions and/or data to be accessed by computer system 600. Such mechanisms, instrumentalities or other approaches can include, for example, a removable storage unit 622 and an interface 620. Examples of the removable storage unit 622 and the interface 620 can include a program cartridge and cartridge interface (such as that found in video game devices), a removable memory chip (such as an EPROM or PROM) and associated socket, a memory stick and USB port, a memory card and associated memory card slot, and/or any other removable storage unit and associated interface. In some embodiments, secondary memory 610, removable storage unit 618, and/or removable storage unit 622 can include one or more of the functions described above with respect to semiconductor device manufacturing apparatus 100.

Computer system 600 can further include a communication or network interface 624. Communication interface 624 enables computer system 600 to communicate and interact with any combination of remote devices, remote networks, remote entities, etc. (individually and collectively referenced by reference number 628). For example, communication interface 624 can allow computer system 600 to communicate with remote devices 628 over communications path 626, which can be wired and/or wireless, and which can include any combination of LANs, WANs, the Internet, etc. Control logic and/or data can be transmitted to and from computer system 600 via communication path 626.

The functions/operations in the preceding embodiments can be implemented in a wide variety of configurations and architectures. Therefore, some or all of the operations in the preceding embodiments—e.g., the functions of semiconductor manufacturing system 500 described in FIG. 5 and the method/process described in FIGS. 3-4—can be performed in hardware, in software or both. In some embodiments, a tangible apparatus or article of manufacture including a tangible computer useable or readable medium having control logic (software) stored thereon is also referred to herein as a computer program product or program storage device. This includes, but is not limited to, computer system 600, main memory 608, secondary memory 610 and removable storage units 618 and 622, as well as tangible articles of manufacture embodying any combination of the foregoing. Such control logic, when executed by one or more data processing devices (such as computer system 600), causes such data processing devices to operate as described herein. For example, the hardware/equipment can be connected to or be part of element 628 (remote device(s), network(s), entity(ies) 628) of computer system 600.

In some embodiments, a semiconductor manufacturing system can include a chamber with a chuck-based device configured to clean the chamber, a loading port coupled to the chamber and configured to hold one or more wafer storage devices, and a control device configured to control a translational displacement and a rotation of the chuck-based device. The chuck-based device can include a based stage, one or more supporting rods disposed at the base stage and configured to be vertically extendable or retractable, and a padding film disposed on the one or more supporting rods.

In some embodiments, a method for cleaning a semiconductor manufacturing apparatus can include determining a contamination level in a chamber of the semiconductor manufacturing apparatus where the chamber can include a chuck-based device, loading a padding film on a stage of the chuck-based device, and moving the padding film in contact with a component in the chamber.

In some embodiments, a method for operating a electrostatic chuck (ESC) to clean a chamber can include placing a padding film on a carrier substrate, placing the substrate on a stage of the ESC, and shifting and rotating the padding film to conduct a wiping activity on a target inside the chamber.

The foregoing disclosure outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for cleaning a chamber of a semiconductor device manufacturing apparatus, comprising:
   determining a contamination level in the chamber, wherein the chamber comprises an electrostatic chuck (ESC);
   in response to the contamination level being equal to or above a reference level, loading a padding film on a substrate that is supported by one or more vertically retractable supporting rods on a stage of the ESC; and
   moving, by displacing the stage of the ESC and stretching or retracting the one or more supporting rods, the padding film in contact with a component in the chamber.

2. The method of claim 1, wherein determining the contamination level in the chamber comprises:
   placing an other substrate in the chamber;
   conducting a semiconductor manufacturing process on the other substrate; and
   determining a particle count on a surface of the other substrate.

3. The method of claim 1, wherein loading the padding film comprises:
   attaching the padding film on the substrate via an adhesive, a tape, or a mechanical component; and
   placing the substrate with the padding film on the stage of the ESC.

4. The method of claim 1, wherein loading the padding film comprises dipping the padding film in an isopropanol, an alcohol, an organic solvent, or a de-ionized water.

5. The method of claim 1, wherein moving the padding film in contact with the component comprises shifting the padding film towards inner surfaces of the chamber, a plasma cell housed in the chamber, or a gas cell housed in the chamber.

6. The method of claim 1, wherein moving the padding film in contact with the component comprises wiping or rubbing the component using the padding film.

7. The method of claim 1, wherein moving the padding film in contact with the component comprises rotating or displacing a stage of the ESC.

8. A method for operating an electrostatic chuck (ESC) to clean a chamber, comprising:
   in response to a comparison result that a contamination level in the chamber is equal to or above a reference level, placing a padding film on a carrier substrate;
   placing the carrier substrate on or re or more vertically retractable supporting rods on a stage of the ESC; and
   shifting and rotating the padding film by displacing and rotating the stage of the ESC and stretching or retracting the one or more supporting rods, to conduct a wiping activity on a target inside the chamber.

9. The method of claim 8, further comprising purging the ESC with an inert gas or air.

10. The method of claim 8, further comprising spraying the padding film with an isopropanol, an alcohol, an organic solvent, or a de-ionized water.

11. The method of claim 8, wherein placing the padding film on the carrier substrate comprises attaching the padding film to the carrier substrate via an adhesive, a tape, a mechanical component, or a Van der Waals force provided by a liquid.

12. The method of claim 8, wherein placing the carrier substrate on the stage comprises securing the carrier substrate on the stage via an electrostatic force.

13. The method of claim 8, wherein the ESC is housed in the chamber, and wherein shifting and rotating the padding film to conduct the wiping activity comprises contactingthe padding film with one or more inner surfaces of the chamber, a gas cell in the chamber, or a plasma cell in the chamber.

14. A method for cleaning a chamber of a semiconductor device manufacturing apparatus, comprising:
   conducting one or more semiconductor manufacturing processes in the semiconductor device manufacturing apparatus, wherein a contaminant from the one or more semiconductor manufacturing processes adheres to a component in the chamber, and wherein the chamber comprises an electrostatic chuck (ESC);
   placing a padding film on a carrier substrate;
   placing the carrier substrate on one or more vertically retractable supporting rods on a stage of the ESC;
   displacing the stage of the ESC and stretching the one or more supporting rods to move the padding film to be in contact with the component; and
   shifting and rotating the padding film to remove the contaminant from the component.

15. The method of claim 14, wherein placing the padding film comprises attaching the padding film to the carrier substrate via an adhesive, a tape, or a clamp.

16. The method of claim 14, wherein placing the carrier substrate comprises:
   applying, via a power supply, a voltage on an electrode of the ESC to secure the carrier substrate on the stage.

17. The method of claim 14, wherein placing the carrier substrate comprises spraying an organic solvent on the padding film.

18. The method of claim 14, wherein shifting and rotating the padding film comprises wiping the component with the padding film.

19. The method of claim 14, wherein shifting and rotating the padding film comprises shifting and rotating the stage.

20. The method of claim 14, wherein shifting and rotating the padding film comprises shifting and rotating the ESC while the component is under a vacuum environment.

* * * * *

UNITED STATES PATENT AND TRADEMARK OFFICE
CERTIFICATE OF CORRECTION

PATENT NO. : 11,211,232 B2
APPLICATION NO. : 16/398667
DATED : December 28, 2021
INVENTOR(S) : Hsieh et al.

Page 1 of 1

It is certified that error appears in the above-identified patent and that said Letters Patent is hereby corrected as shown below:

In the Claims

In Column 14, Claim 8, Line 6, delete "on re" and insert --one--, therefor.

In Column 14, Claim 13, Line 26, delete "contactingthe" and insert --contacting the--, therefor.

Signed and Sealed this
Fifteenth Day of February, 2022

Drew Hirshfeld
*Performing the Functions and Duties of the
Under Secretary of Commerce for Intellectual Property and
Director of the United States Patent and Trademark Office*